United States Patent [19]
Yamaguchi

[11] Patent Number: 5,604,372
[45] Date of Patent: Feb. 18, 1997

[54] SEMICONDUCTOR PRESSURE SENSOR APPARATUS

[75] Inventor: Yasuo Yamaguchi, Itami, Japan

[73] Assignee: Mitsubishi Denki Kabushiki Kaisha, Tokyo, Japan

[21] Appl. No.: 521,061

[22] Filed: Aug. 29, 1995

[30] Foreign Application Priority Data

Aug. 30, 1994 [JP] Japan .................................. 6-205448

[51] Int. Cl.⁶ ........................... H01L 27/14; H01L 29/82; H01L 29/84
[52] U.S. Cl. ........................ 257/417; 257/414; 257/415; 257/687; 257/787
[58] Field of Search ................................ 257/414, 415, 257/417, 418, 678, 687, 787, 790

[56] References Cited

U.S. PATENT DOCUMENTS

3,210,618 10/1965 Rosenberg et al. ..................... 257/687
5,436,491 7/1995 Hase et al. ............................... 257/687

*Primary Examiner*—Carl Whitehead, Jr.
*Attorney, Agent, or Firm*—Leydig, Voit & Mayer

[57] ABSTRACT

A pressure sensor apparatus sealed by a resin in which resin flash in the resin sealing process is prevented from occurring, eliminating the necessity of removing such flash and achieving a pressure sensor apparatus which may be manufactured relatively easily at a lower price and with a higher reliability. A semiconductor pressure sensing element is mounted on a stem and signals lines for outputting an electrical signal indicating a pressure detected extend through the stem. An annular stopper for preventing resin flash resulting from the sealing resin flowing to an unwanted location surrounds both the semiconductor pressure sensing element and the signal lines.

9 Claims, 7 Drawing Sheets

SEMICONDUCTOR PRESSURE SENSOR APPARATUS

BACKGROUND OF THE INVENTION

1. Field of the Invention

This invention relates to a semiconductor pressure sensor apparatus and, more particularly, to resin-sealed semiconductor pressure sensor apparatus. This invention also relates to a mold die for use encapsulating the semiconductor pressure sensor apparatus.

2. Description of the Related Art

Figure 6:
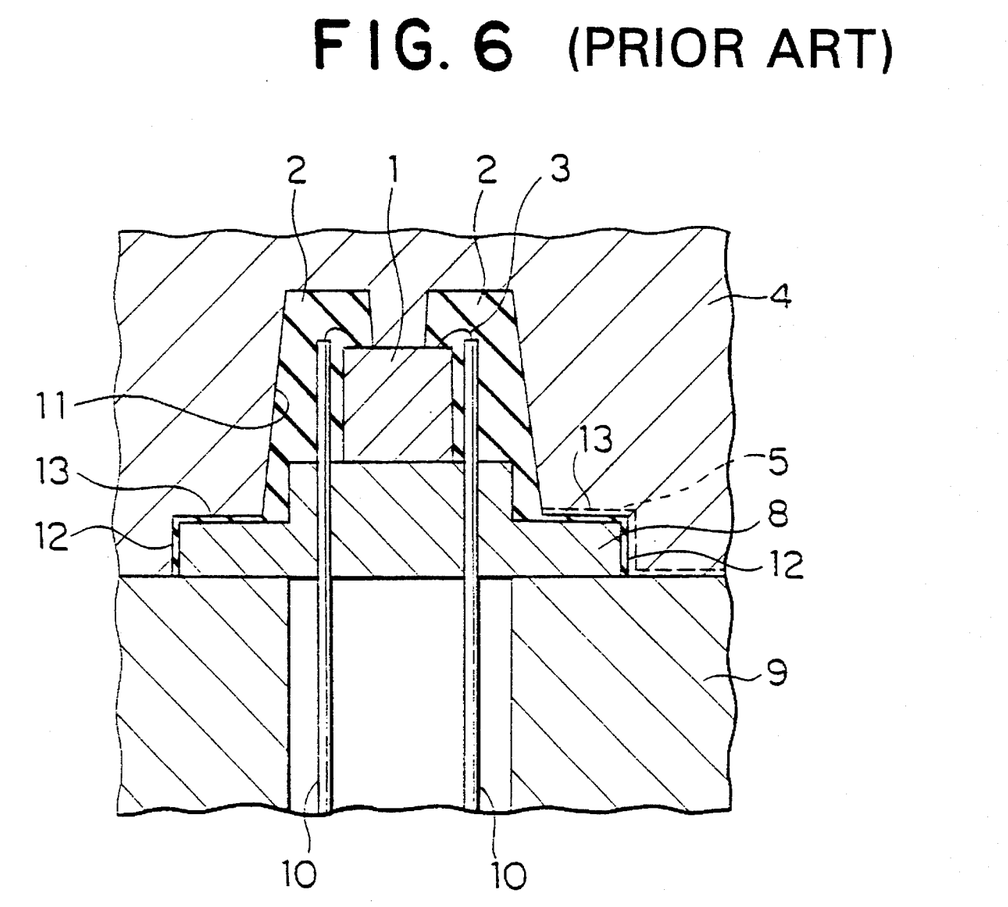
FIG. 6 is a sectional view showing a privately known molding process of a semiconductor pressure sensor apparatus.

FIG. 6 is a sectional view showing the process for resin-sealing a known semiconductor pressure sensor apparatus within a mold die. The semiconductor pressure sensor apparatus as shown includes: a semiconductor pressure sensing element 1; a stem (seating base) 8 which is formed, for example, of iron or kovar and to which the semiconductor pressure sensing element 1 is firmly fixed by means of die-bonding or the like; signal lines 10 extending through the stem 8 for outputting to the outside an electrical signal indicating a pressure detected by the semiconductor pressure sensing element 1; and bonding wires 3 for electrically connecting each signal line 10 to the semiconductor pressure sensing element 1. As shown, the apparatus is encapsulated, i.e., resin-sealed, by a resin 2, such as an epoxy resin, within a resin-sealing mold die 4, 9. Here, a part of the surface of the semiconductor pressure sensing element 1 is not resin-sealed in order to be serve as a pressure detecting portion. The resin-sealing mold die 4, 9 is constituted by two mold halves, i.e., an upper mold 4 and a lower mold 9. The upper and lower molds 4 and 9 together form a cavity (space) 11 for holding the semiconductor pressure sensing element 1 to seal it in the resin. Further, an injecting groove 5 for injecting a resin is formed on a lower portion of the upper mold 4, as shown in FIG. 6 by a dotted line.

A method for sealing the apparatus will now be described in further detail. The semiconductor pressure sensor apparatus after both the die bonding process with the above described stem 8 and the wire bonding process with the wire 3 is inserted into the cavity 11 as shown in FIG. 6 which is formed by the upper and lower molds 4 and 9 as mentioned above. In this state, as the resin 2 is injected into the cavity 11 through the injecting groove 5, the apparatus is resin-sealed under pressure.

In the known semiconductor pressure sensor apparatus manufactured as described above, a gap 12 between the stem 8 and the mold die 4, 9 sometimes occurs due to variations in the thickness of the stem 8 or deformation and wear due to abrasion in the surface of the mold die 4, 9. In such a case, the resin 2 undesirably enters the gap 12 in the molding process so as to form a flash or burr 13 (see FIG. 7) of the resin, resulting in a problem that the undesirable flash 13 remains as unwanted resin on the surface of the stem 8.

Figure 7:
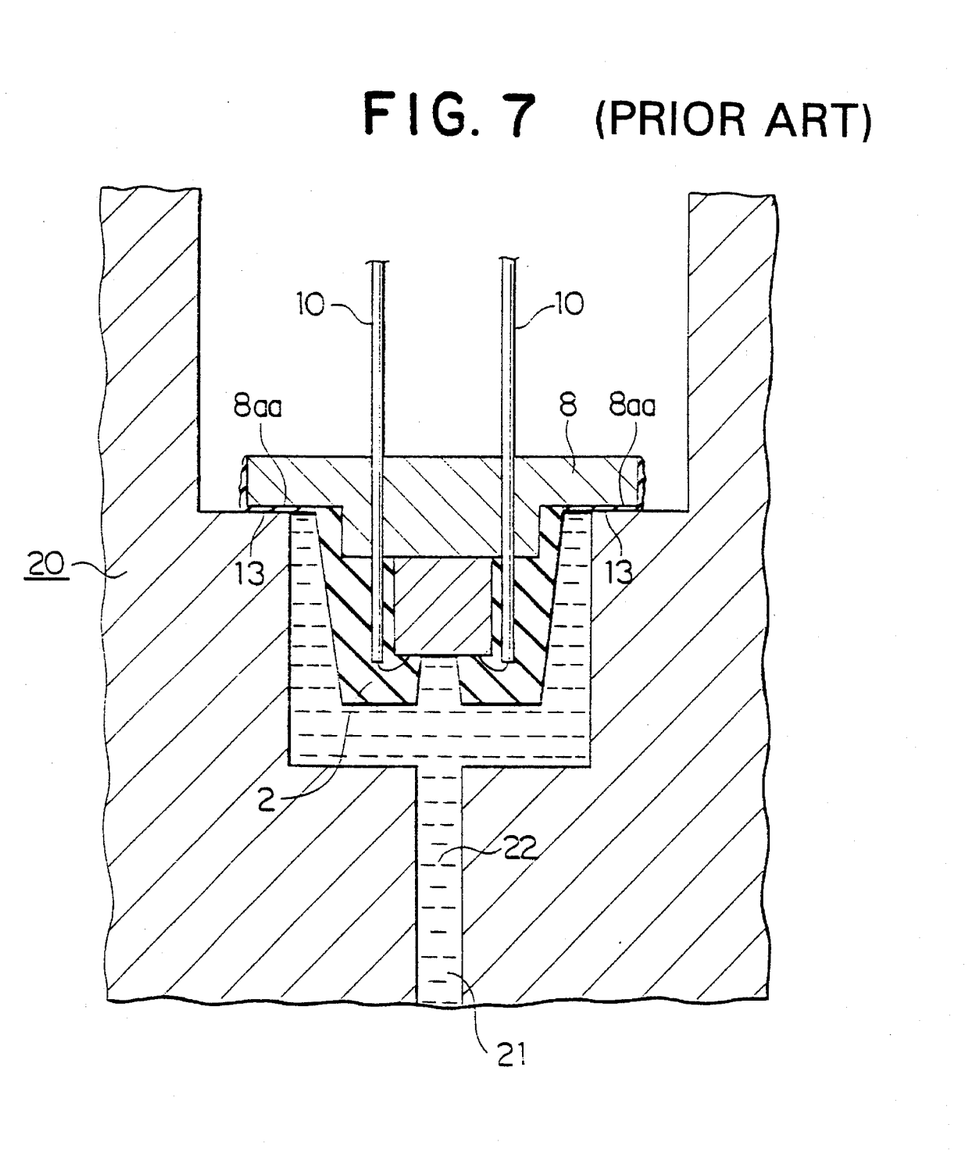
FIG. 7 is a sectional view showing the state where a privately known semiconductor pressure apparatus is mounted for use.

Since the molded semiconductor pressure sensor apparatus is welded to a metal package 20 at an outer peripheral portion 8aa of the stem 8, as shown in FIG. 7, when the resin flash 13 is present on the outer periphery 8aa of the stem 8, a partial gap occurs between the outer periphery 8aa and the metal package 20. A pressure transmitting fluid medium 22, such as silicone oil filling in a pressure transmitting path 21 within the metal package 20 leaks to the outside from such gap, resulting in a problem that the reliability of apparatus is lowered by the undesirable resin flash 13.

For this reason, in the known semiconductor pressure sensor apparatus, the flash 13 has been removed by mechanical polishing. However, the resin flash 13 adhered to the stem 8, which is made of a metal such as iron is highly adhesive and it is difficult to remove it. Further, its manufacturing process becomes complicated because removal of the resin flash 13 is required. Accordingly, its manufacturing cost is increased, and results in a higher price for the product.

SUMMARY OF THE INVENTION

To solve the above described problems, it is an object of the present invention to provide a semiconductor pressure sensor apparatus and a mold die in which the process for removing a resin flash is eliminated by preventing occurrence of the flash, achieving an easier and simple manufacturing process, a lower product price and higher reliability.

In one aspect of the present invention, there is provided a semiconductor pressure sensor apparatus including: a semiconductor pressure sensing means for detecting pressure; a seating base having a center portion for mounting the semiconductor pressure sensing means thereon and a peripheral portion to be sealingly attached when the apparatus is mounted; a signal line extending through the seating base and electrically connected to the semiconductor pressure sensing means for outputting a signal indicating the pressure detected by the semiconductor pressure sensing means to the outside of the apparatus; and an annular resin leakage prevention means on the seating base surrounding the semiconductor pressure sensing means and the signal lines to prevent a mold resin for sealing said semiconductor pressure sensing means from adhering to said peripheral portion.

In accordance with this aspect of the invention, since the resin leakage prevention means is provided, the resin for resin-sealing the semiconductor pressure sensing means and associated parts are prevented from remaining as a resin flash bulging out from the mold and adhering to unwanted location on the seating base.

In another aspect of the invention, a sealing resin is provided to seal the semiconductor pressure sensing means, one end of each signal line on the side connected to the semiconductor pressure sensing means and the seating base excluding at least the peripheral portion.

In accordance with this aspect of the invention, a sealing resin is provided for sealing the semiconductor pressure sensing means, one end of each signal line connected to the semiconductor pressure sensing means and an area on the seating base excluding at least the outer peripheral portion thereof. The semiconductor pressure sensing means and the connected portion of the signal lines are mechanically protected by the sealing resin, increasing the reliability of the apparatus.

In another aspect o the invention, the resin leakage prevention means comprises a continuous annular protrusion provided on the inner side of the outer peripheral portion of the seating base.

In accordance with this aspect of the invention, the resin leakage prevention means is a continuous annular protrusion provided inwardly of the outer periphery of the seating base. The occurrence of resin flash is prevented on the outer periphery, which is a joining portion for mounting the apparatus.

In still another aspect of the invention, the resin leakage prevention means comprises a continuous annular protrusion surrounding the semiconductor pressure sensing means and extending to an outer edge on the outer peripheral portion of the seating base.

In accordance with this aspect of the invention, the resin leakage prevention means is a continuous annular protrusion surrounding the semiconductor pressure sensing means and extending to the outer edge of the outer peripheral portion of the seating base. Leakage of the resin is completely prevented by a side surface of the protrusion, whereby none of the resin adheres to the upper surface of the protrusion.

In another aspect of the invention, the protrusion comprises an elastic resin.

In accordance with this aspect of the invention, since the protrusion is an elastic resin, the resin sealing mold and the protrusion closely contact each other to completely prevent the sealing resin from bulging outward.

In another aspect of the invention, the protrusion is formed integrally with the seating base.

In accordance with the aspect of the invention, the protrusion may be formed simultaneously and easily when forming the seating base, since it is molded integrally with the seating base.

In further aspect of the invention, the resin leakage prevention means comprises a continuous annular recess provided on the inner side of the outer peripheral portion of the seating base.

In accordance with this aspect of the invention, the resin leakage prevention means is a continuous annular recess provided inwardly of the outer peripheral portion of the seating base. The sealing resin stays in the recess even when the resin has bulged out from the sealing mold, whereby no portion of the sealing resin adheres to the outer peripheral portion of the seating base and no resin flash occurs.

In another aspect of the invention, there is provided a resin sealing mold for resin-sealing a semiconductor pressure sensor apparatus, the apparatus including: a semiconductor pressure sensing means for detecting a pressure; a seating base having a center portion for placing the semiconductor pressure sensing means thereon and a peripheral portion for sealingly attaching to an external unit when mounted; and an annular resin leakage prevention means provided on the seating base surrounding the semiconductor pressure sensing means, the resin sealing mold comprising: a lower mold having a seating base receiving portion indented for placing the seating base; a middle mold placed upon the lower mold in close contact with the resin leakage prevention means at its lower surface and surrounding the semiconductor pressure sensing means; an upper mold placed upon the middle mold so as to seal the semiconductor pressure sensing means in cooperation with the middle mold and contacting a portion of the semiconductor pressure sensing means; and a resin injecting groove or injecting a sealing resin provided along the boundary of one of the middle mold or the lower mold, the resin sealing mold resin-sealing the semiconductor pressure sensing means and an area on the seating base excluding at least the peripheral portion.

In accordance with this aspect of the invention, since the resin leakage prevention means of the semiconductor pressure sensor apparatus and the middle mold are in close contact with each other, flowing out of the sealing resin is stopped by the resin leakage prevention means. Resin flash as a result of the sealing resin adhering to unwanted locations is prevented.

In another aspect of the invention, a flange is provided on a lower surface of the middle mold for contacting a portion on the seating base outward of the semiconductor pressure sensing means and inward from the resin leakage prevention means.

In accordance with this aspect of the invention, most of the sealing resin is prevented from flowing out by a flange provided on the middle mold and flow of the resin is completely stopped by the resin leakage prevention means. Formation of a resin flash as a result of the resin adhering to unwanted location is prevented.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

Embodiment 1

Figure 1:
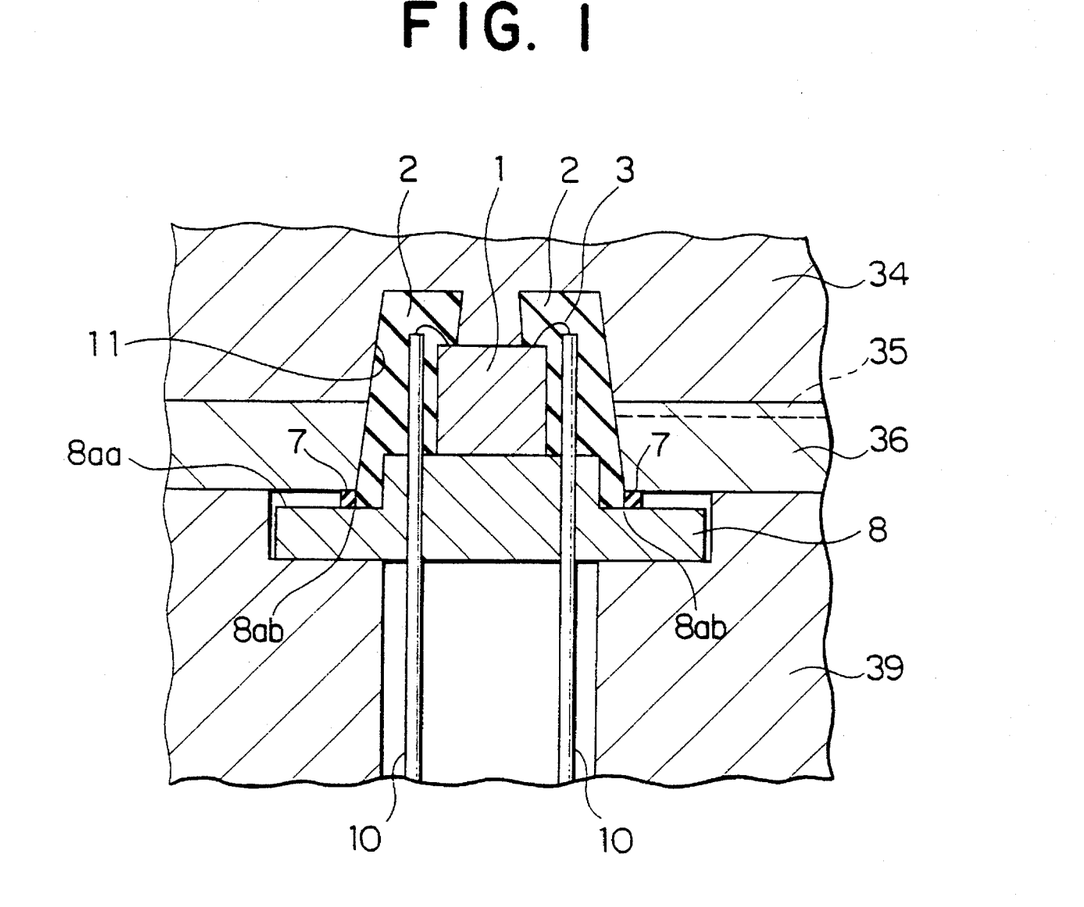
FIG. 1 is a sectional few showing the molding process of a semiconductor pressure sensor apparatus according to Embodiment 1 of the present invention.
Figure 2:
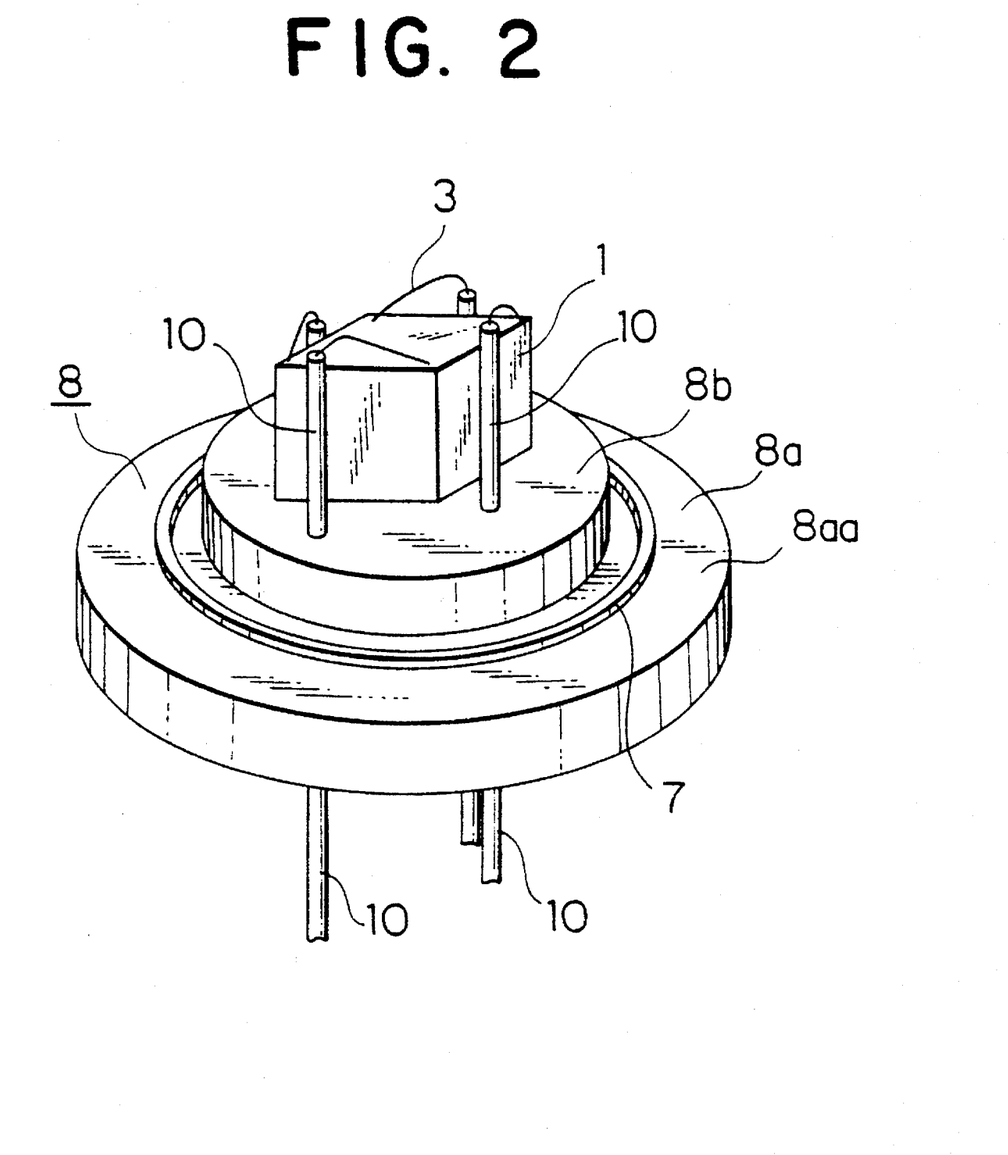
FIG. 2 is a perspective view showing the semiconductor pressure sensor apparatus illustrated in FIG. 1.

FIG. 2 is a perspective view showing an embodiment of a semiconductor pressure sensor apparatus of the present invention. FIG. 1 is a cross sectional view showing the method for molding the semiconductor pressure sensor apparatus of FIG. 2. As shown in FIG. 2, the semiconductor pressure sensing element 1 is firmly fixed to the stem 8 by die bonding. The stem 8 is made of metal such as iron or kovar and, as shown, has an inverted-T shaped cross section. Formed integrally on a disk-like base portion 8a is a disk-like protuberance 8b having a diameter smaller than that of the coaxial base portion 8a. Here, in as in the known semiconductor pressure sensor apparatus shown in FIG. 7, an outer peripheral portion 8aa of the major surface of the base portion 8a of the stem 8, when mounted, is joined with and sealingly attached to the metal package 20 (see FIG. 7) by means of welding. Further, signal lines 10 for outputting an electrical signal indicating a pressure detected extend through the stem 8. As shown, the signal lines 10 and the semiconductor pressure sensing element 1 are electrically connected to each other by means of wire 3.

In this embodiment, a stopper 7 serving as the resin leakage prevention means for preventing unnecessary and undesirable resin from adhering in the molding process is provided as shown in FIG. 2 on the base portion 8a of the stem 8. The stopper 7 is formed into the shape of a ring of silicone resin or the like that is elastic. It is disposed as shown in FIG. 1 along the periphery of a boundary line 8ab of the area intended to be sealed on the base portion 8a.

However, since purpose of the stopper 7 is to prevent an occurrence of resin flash 13 (see FIG. 7) on the outer periphery 8aa of the stem 8 which is to be joined with the metal package 20, the stopper 7 may be provided at any location outside the boundary line 8ab of the intended molded area, except on the outer peripheral portion 8aa which constitutes the joining surface with the metal package 20. Further, the stopper 7 may be readily provided as it can be formed for example, by a stamp printing method.

After formed in the manner as described above, the semiconductor pressure sensor apparatus of the present invention is molded or resin-sealed within a resin sealing mold die. In this embodiment, the mold die includes a lower mold 39, a middle mold 36 and an upper mold 34 as shown in FIG. 1. A resin injecting groove 35 is formed in the middle mold 36 as indicated by a broken line of FIG. 1. The method for molding the apparatus will now be described. First, the semiconductor pressure sensor apparatus formed as shown in FIG. 2 is mounted on the lower mold 39. The middle mold 36 and upper mold 34 are then placed upon the lower mold 39. At this time, since the stopper 7 is formed of an elastic, the stopper 7 and the middle mold 6 are completely in close contact with each other.

Next, in this state, resin 2, such as an epoxy resin, is injected through the injecting groove 35 into the cavity 11. At this time, the resin 2 is completely stopped by the stopper 7. The portion outside of the stopper 7, i.e., at least the outer periphery 8aa of the stem 8 which is to be joined with the metal package 20 (see FIG. 7) at the time of its mounting, is free from resin flash 13 (see FIG. 6).

As described above, in this embodiment, by providing the stopper 7 which serves as the resin leakage prevention means, occurrence of resin flash 13 (see FIG. 6) on the outer periphery 8aa of the stem 8 to be joined with the metal package 20 (see FIG. 7) when mounting the apparatus is prevented. The manufacturing process of the apparatus becomes easier and the removal of the resin flash 13 is unnecessary and the costs of the apparatus may be correspondingly lowered. Further, since a gap due to a resin flash 13 does not occur at the joining portion with the metal package 20, no leakage of the pressure transmitting medium 21 filling the pressure transmitting path 21 (see FIG. 7) of the metal package 20 occurs. Thus, the reliability of the apparatus can be improved.

It should be noted that, while forming of the stopper 7 with a resin is shown in Embodiment 1, it is also possible to form the stopper 7 integrally with the stem 8 using the same material. In this case, as the amount of resin leaking over the stopper 7 is not so large, the integrally formed stopper 7 is sufficient to stop it. Also, if necessary, a silicone resin may be disposed on the integrally formed stopper 7 by means of stamp printing or the like.

Embodiment 2

Figure 3:
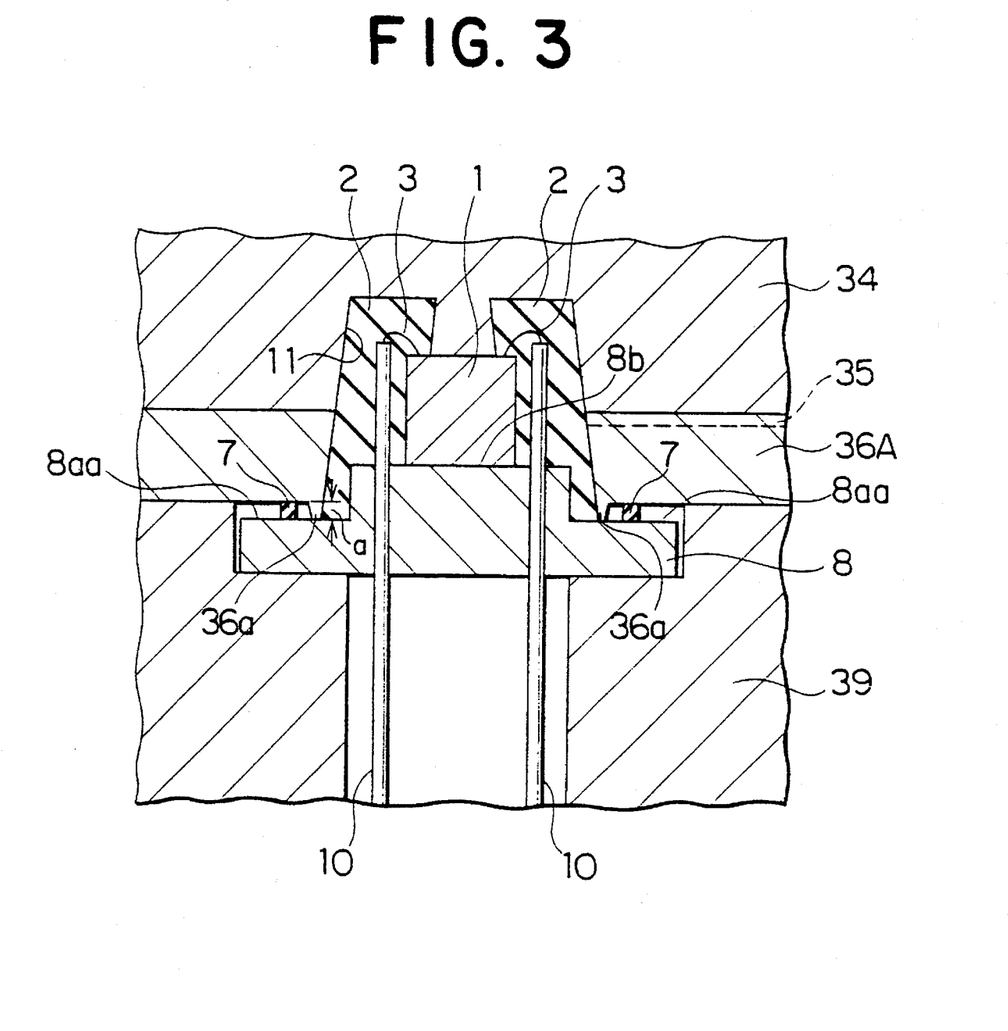
FIG. 3 is a sectional view showing the resin molding process of a semiconductor pressure sensor apparatus according to Embodiment 2 of the present invention.

FIG. 3 shows another embodiment of the present invention. In this embodiment, a flange 36a is provided as shown in FIG. 3 on a lower portion of the middle mold 36. The cavity 11 is formed by the upper mold 34, the middle mold 36 and the flange 36a of middle mold 36A. The semiconductor pressure sensing element 1, wire 3, one end portion of each signal line 10 connected to the wire 3 and protrusion 8b of the stem 8 are contained in the cavity 11. In this embodiment, the stopper 7 serving as the resin leakage prevention means is disposed at a portion of the stem 8 to be positioned outside of the flange 36a in the mold die. The construction of the stopper 7 is identical to that of Embodiment 1 and a description thereof will be omitted. It should be noted that, supposing the height of the flange 36a is "a" as noted in FIG. 3, preferably the stopper 7 is formed of an elastic material having a height "6" where a<b.

Next, in this state, resin 2, such as an epoxy resin, is injected through the injecting groove 35 into the cavity 11. At this time, the resin 2 is completely stopped by the stopper 7 even if the resin 2 overflows from the cavity 11 if a gap occurs between the flange 36a and the stem 8 due to deformation or wearing of the middle mold 37 or due to dispersion in the thickness of the stem 8. Therefore, the portion outside of the stopper 7, i.e., the outer periphery 8aa of the stem 8 which is to be joined with the metal package 20 (see FIG. 7) at the time of mounting of the apparatus is free from resin flash 13 (see FIG. 6).

In this embodiment, too, an occurrence of the resin flash 13 (see FIG. 7) may be prevented in a similar manner as in the above described Embodiment 2. A semiconductor pressure sensor apparatus of low cost and high reliability may be obtained by an easy manufacturing process.

Embodiment 3

Figure 4:
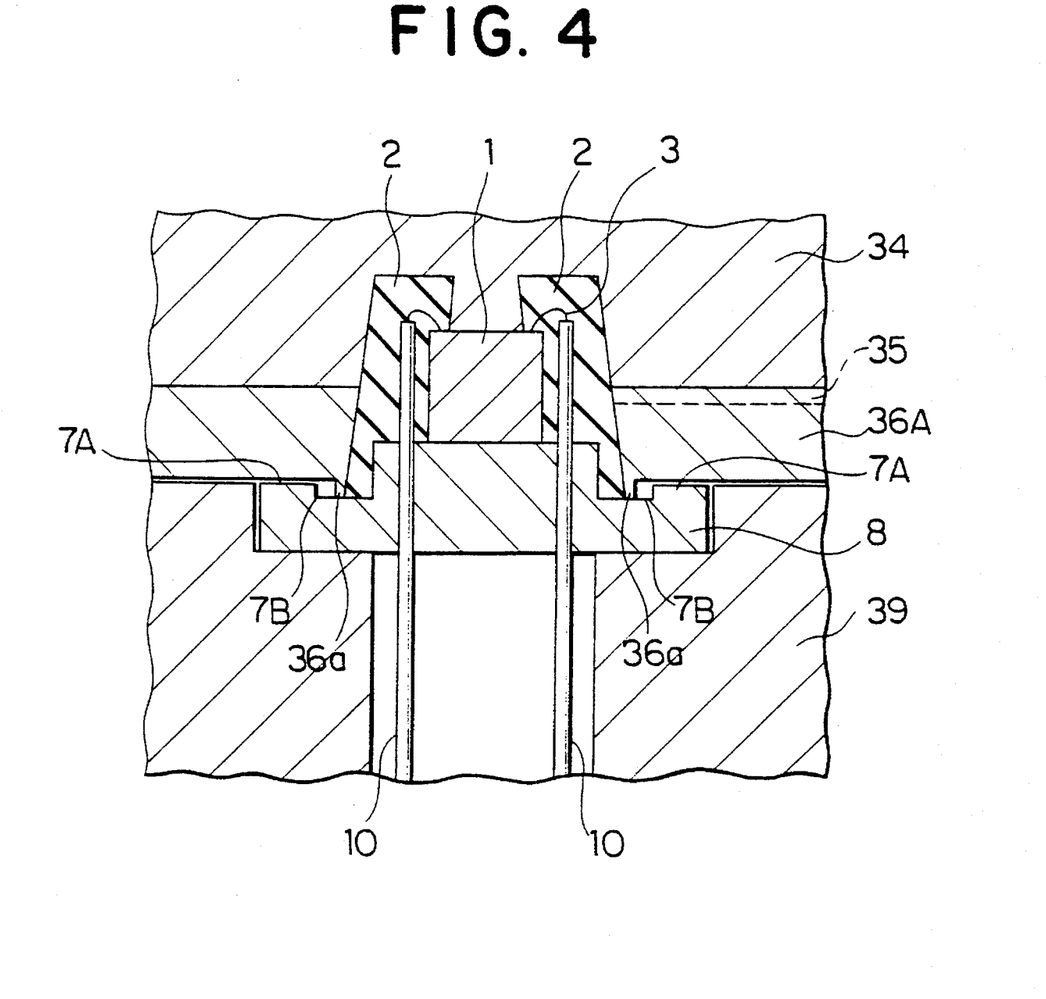
FIG. 4 is a sectional view showing the molding process of a semiconductor pressure sensor apparatus according to Embodiment 3 of the present invention.

FIG. 4 shows another embodiment of the invention. In this embodiment, as shown in FIG. 4, a stopper 7A is provided in a manner extended to the outer peripheral portion 8aa of the stem 8. Accordingly, in this embodiment, the stopper 7A prevents overflow over of the resin and is joined at its surface with the metal package 20 (see FIG. 7) when mounting the apparatus. For this reason, it is preferably formed integrally with the stem 8 of the same material as the stem 8. The other structures are the same as those illustrated in FIGS. 1 and 3.

In this embodiment, too, a flange 36a is provided on the middle mold 36A of the mold die. As a result, a groove 7B is formed as shown, between the flange 36a and the stopper 7A. Most of the resin 2 which has been injected into the cavity 11 through the injecting groove 35 is stopped by the flange 36a. Even if a part of the resin 2 bulges out from a gap between the flange 6a and the stem 8, it is completely stopped by the stopper 7A. It stays within the groove 7B, no resin flash 13 (see FIG. 7) occurs onto the surface of the stopper 7A.

In this embodiment, too, it is possible to prevent the resin flash 13 (see FIG. 7) on the joining portion (i.e., the surface of the stopper 7A in this embodiment) to be joined with the metal package 20 (see FIG. 7) when the apparatus is mounted. Similar advantages as Embodiments 1 and 2 may be obtained. Further, in this embodiment, since the stopper 7A is integrally formed with the stem 8, the manufacturing process may be furthermore facilitated.

Embodiment 4

Figure 5:
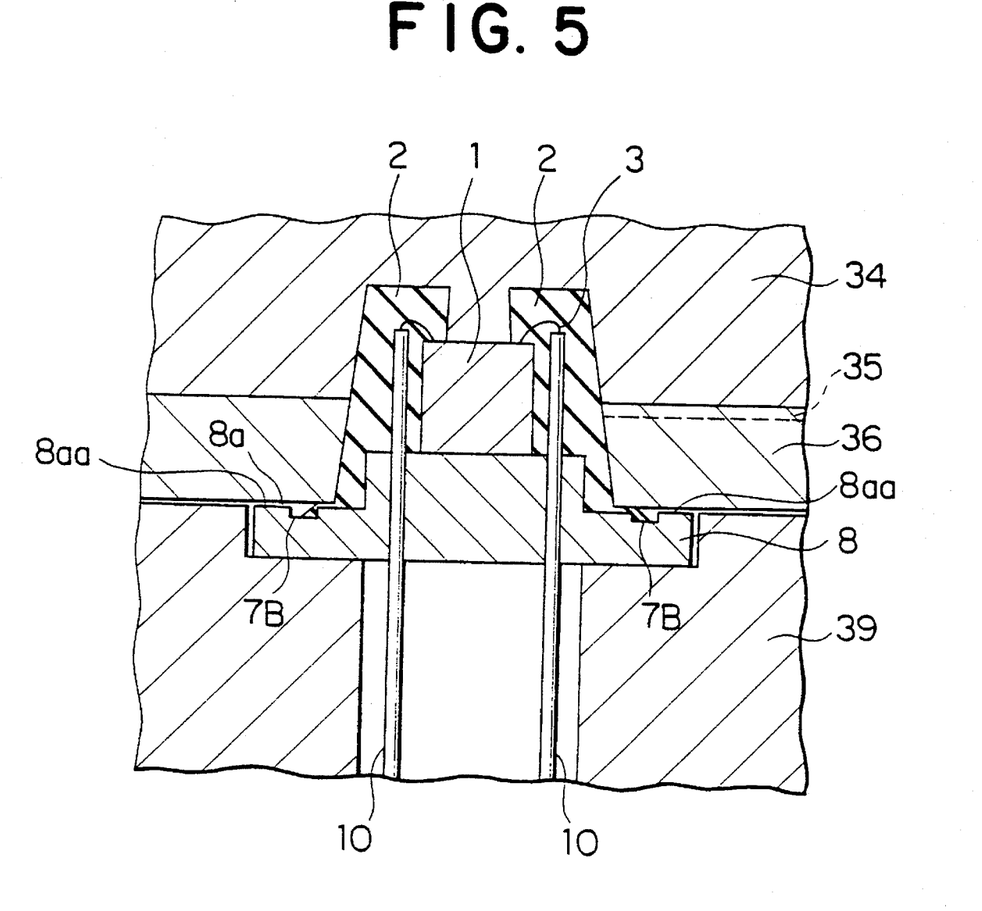
FIG. 5 is a sectional view showing the molding process of a semiconductor pressure sensor apparatus according to Embodiment 4 of the present invention.

FIG. 5 shows still another embodiment of the present invention. In this embodiment, an annular groove 7B is provided on the base portion 8a of the stem 8 as a resin leakage prevention means. The groove 7B is provided in the form of a ring at exactly the same position as the stopper 7 as shown in FIG. 2. The groove 7B may be formed at the time of manufacturing the stem 8, It is therefore readily formed. The middle mold 36 is placed so that its lower surface is in close contact with the opening of the groove 7B. At this time, even if a gap occurs between the middle mold 36 and the stem 8 due to deformation or wear of the resin sealing middle mold 36 and lower mold 39 or variation in the thickness of the stem 8, the resin 2 stays in the groove 7B and does not reach the outer periphery 8aa of the stem 8. In this embodiment, too, it is possible to prevent an occurrence of resin flash 13 (see FIG. 7) on the outer peripheral portion of the stem 8 which serves as the joining portion to be joined with the metal package 20 (see FIG. 7) when mounting the apparatus. Similar advantages as in Embodiments 1 to 3 may be obtained.

It should be noted that, while the cross section of the groove 7B in this embodiment is rectangular, the present invention is not so limited. Any shape including U-shaped, trapezoidal, inverted-trapezoidal and V-shaped cross sections may be used as long as the inner product thereof is sufficient for retaining the excess resin flowing out from the cavity 11.

In accordance with one aspect of the invention, since a resin leakage prevention means is provided, it is possible to prevent the resin from flowing out to the outer periphery of the seating base and adhering thereto to remain as resin flash when the semiconductor pressure sensing element is to be resin-sealed or molded in a mold die. For this reason, the outer periphery is joined to another element without a gap when mounted. Reliability of the apparatus is improved and no process of removing resin flash is necessary. An advantage is achieved in that the manufacturing process is facilitated and the manufacturing costs may be correspondingly lowered.

In accordance with another aspect of the invention, a sealing resin is provided for sealing the semiconductor pressure sensing element, one end of each signal line connected to the semiconductor pressure sensing element and an area on the seating base excluding at least the outer peripheral portion thereof. An advantage is achieved in that the semiconductor pressure sensing element and the connected portion of the signal lines are mechanically protected by the sealing resin, increasing the reliability of the apparatus.

In accordance with still the other aspect of the invention, the resin leakage prevention means includes a continuous annular protrusion provided on the inner side of the outer periphery of the seating base. An advantage may be achieved in that an occurrence of resin flash on the outer periphery which is a joining portion for apparatus is prevented.

In accordance with the other aspect of the invention, the resin leakage prevention means includes a continuous annular protrusion surrounding the semiconductor pressure sensing element extending to the outer edge of the outer peripheral portion of the seating base. Leakage of the resin is completely prevented by a side surface of the protrusion, whereby none of the resin adheres to the upper surface of the protrusion and resin flash is prevented.

In accordance with a further aspect of the invention, since the protrusion may be an elastic resin, the resin sealing mold die and the protrusion closely contact each other so that the flowing out of the sealing resin may be completely prevented.

In accordance with still another aspect of the invention, since the protrusion is molded integrally with the seating base, it may be formed simultaneously and easily when forming the seating base, furthermore facilitating its manufacturing process.

In accordance with another aspect of the invention, the resin leakage prevention means includes a continuous annular recess provided on the inner side of the outer peripheral portion of the seating base. The sealing resin stays in the recess even when the resin has bulged out from the sealing mold die, whereby no portion of the sealing resin adheres to the outer peripheral portion of the seating base and resin flash may be prevented.

In accordance with another aspect of the invention, since the resin leakage prevention means of the semiconductor pressure sensor apparatus and the middle mold are in close contact with each other, flowing out of the sealing resin is stopped by the resin leakage prevention means. An occurrence of resin flash as a result of the sealing resin adhering to unwanted locations may be prevented.

In accordance with still further another aspect of the invention, most of the sealing resin is prevented from flowing out by a flange provided on the middle mold and the portion of the resin flowing out is completely stopped by the resin leakage prevention means. Formation of a resin flash as a result of the resin adhering to unwanted location may be prevented.

What is claimed is:

1. A semiconductor pressure sensor apparatus comprising:

semiconductor pressure sensing means for detecting pressure;

a seating base having a center portion on which said semiconductor pressure sensing means is mounted and a peripheral portion for sealing attachment to an external element;

a signal line extending through said seating base and electrically connected to said semiconductor pressure sensing means for outputting a signal indicating pressure detected by said semiconductor pressure sensing means; and annular leakage prevention means, disposed on said seating base surrounding said semiconductor pressure sensing means and said signal line, for preventing molten resin, during sealing of said semiconductor pressure sensing means in said resin, from reaching said peripheral portion.

2. The semiconductor pressure sensor apparatus as claimed in claim 1, comprising a resin sealing said semiconductor pressure sensing means, one end of said signal line connected to said semiconductor pressure sensing means and said seating base and excluding said peripheral portion of.

3. The semiconductor pressure sensor apparatus as claimed in claim 1, wherein said annular leakage prevention means comprises a continuous annular protrusion on an inner side of said outer peripheral portion of said seating base.

4. The semiconductor pressure sensor apparatus as claimed in claim 3, wherein said protrusion comprises an elastic resin.

5. The semiconductor pressure sensor apparatus as claimed in claim 3, wherein said protrusion is unitary with said seating base.

6. The semiconductor pressure sensor apparatus as claimed in claim 1, wherein said annular leakage prevention means comprises a continuous annular protrusion surrounding said semiconductor pressure sensing means and extending to an outer edge of said outer peripheral portion of said seating base.

7. The semiconductor pressure sensor apparatus as claimed in claim 6, wherein said protrusion comprises an elastic resin.

8. The semiconductor pressure sensor apparatus as claimed in claim 6, wherein said protrusion is unitary with said seating base.

9. The semiconductor pressure sensor apparatus as claimed in claim 1, wherein said annular leakage prevention means comprises a continuous annular recess in said outer peripheral portion of said seating base.

* * * * *